United States Patent [19]

Niwayama et al.

[11] Patent Number: 5,428,229
[45] Date of Patent: Jun. 27, 1995

[54] PRESSURE CONTACT TYPE MOS SEMICONDUCTOR DEVICE AND FABRICATION METHOD OF THE SAME

[75] Inventors: Kazuhiko Niwayama; Futoshi Tokunou, both of Fukuoka, Japan

[73] Assignee: Mitsubishi Denki Kabushiki Kaisha, Tokyo, Japan

[21] Appl. No.: 323,697

[22] Filed: Oct. 18, 1994

Related U.S. Application Data

[63] Continuation of Ser. No. 871,681, Apr. 21, 1992, abandoned.

[30] Foreign Application Priority Data

Apr. 23, 1991 [JP] Japan ................. 3-91882

[51] Int. Cl.⁶ .......................................... H01L 29/10
[52] U.S. Cl. .............................. 257/144; 257/153; 257/170; 257/178; 257/341; 257/181
[58] Field of Search ............... 257/144, 340, 341, 342, 257/170, 178, 330, 335, 152, 153, 181

[56] References Cited

U.S. PATENT DOCUMENTS

| | | | |
|---|---|---|---|
| 4,155,155 | 5/1979 | Bourdon et al. | 257/178 |
| 4,320,571 | 3/1982 | Hauck . | |
| 4,597,001 | 6/1986 | Bortscheller et al. | 257/340 |
| 4,851,889 | 7/1989 | Matsuzaki | 257/144 |
| 4,862,239 | 8/1989 | Broich et al. | 257/144 |
| 4,881,120 | 11/1989 | Nakagawa et al. | 257/144 |

FOREIGN PATENT DOCUMENTS

| | | | |
|---|---|---|---|
| 0014761 | 9/1980 | European Pat. Off. . | |
| 0080953 | 6/1983 | European Pat. Off. . | |
| 0112607 | 7/1984 | European Pat. Off. . | |
| 0308612 | 3/1989 | European Pat. Off. . | |
| 0433650 | 6/1991 | European Pat. Off. . | |
| 2436504 | 4/1980 | France . | |
| 3114971 | 1/1982 | Germany | 257/341 |
| 3427293 | 2/1985 | Germany . | |
| 57-64969 | 4/1982 | Japan | 257/170 |
| 59-89465 | 5/1984 | Japan . | |
| 64-59824 | 3/1989 | Japan . | |

OTHER PUBLICATIONS

Patent Abstracts of Japan, vol. 7, No. 186 (E-193)(1331), Aug. 16, 1983, JP-A-58 89 864, May 28, 1983.
International Electron Devices Meeting Technical Digest Washington, D.C., Dec. 8-10, 1980, pp. 91-94, J. Mena, et al., "High Frequency Performance of VDMOS Power Transistors".
International Electron Devices Meeting Technical Digest San Francisco, Ca, Dec. 13-15, 1982 pp. 250-253, D. Fuoss, "Vertical DMOS Power Field-Effect Transistors Optimized for High-Speed Operation".
Patent Abstracts of Japan, vol. 009, No. 147 (E-323), Jun. 21, 1985, JP-A-60 027 170, Feb. 12, 1985.
Patent Abstracts of Japan, vol. 13, No. 439 (E-827) (3787), Oct. 3, 1989 & JP-A-11 68 066, Jul. 3, 1989.
Patent Abstracts of Japan, vol. 14, No. 413 (E-974) (4356), Sep. 6, 1990, JP-A-21 56 677, Jun. 15, 1990.
Sakai et al., "A New VDMOSFET Structure with Reduced Reverse Transfer Capacitance," *IEEE Transactions on Electron Devices*, vol. 36, No. 7, Jul. 1989, pp. 1381-6.

*Primary Examiner*—Jerome Jackson
*Assistant Examiner*—Courtney A. Bowers
*Attorney, Agent, or Firm*—Oblon, Spivak, McClelland, Maier & Neustadt

[57] ABSTRACT

A MOS semiconductor device which exhibits high switching operations including high turn-on and an excellent self-cooling capability. The device prevents damage to insulation films and electrodes thereof. An IGT includes a multi-layer structure having a p type emitter layer, an n type base layer, a p type base layer and an n type emitter layer superimposed therein. A gate electrode and an overlying gate oxide film are disposed on a recessed surface of the multi-layer structure. A cathode electrode is located only in and around a cathode surface so that most of the top surface of the gate electrode is uncovered. Via an intervening cathode distortion snubbering plate, the cathode electrode is in pressure contact with a cathode electrode body. The gate and the cathode electrodes have a reduced capacitance therebetween. The cathode electrode body serves to cool the cathode electrode. The gate electrode and the gate oxide film are protected from stress, and hence, will not be damaged by stress.

8 Claims, 24 Drawing Sheets

PRESSURE CONTACT TYPE MOS SEMICONDUCTOR DEVICE AND FABRICATION METHOD OF THE SAME

This application is a Continuation of application Ser. No. 07/871,681, filed on Apr. 21, 1992, now abandoned.

BACKGROUND OF THE INVENTION

1. Field of the Invention

The present invention relates to a MOS semiconductor device and a fabrication method of the same.

2. Description of the Background Art

A gate-controlled device in which main current is controlled by MOS structure gate is generally referred to as a MOS semiconductor device. Among those MOS-gate-controlled semiconductor devices known in the art are: a MOS-controlled thyristor (MCT) proposed by V. A. K. Temple, IEEE Trans. on Electron Devices, ED-33, page 1609; and an insulated gate transistor (IGT) suggested by B. J. Baliga, IEEE Electron Device Lett., EDL-14, page 452.

FIG. 28 shows a unit cell 100 of an IGT device as viewed from above and in cross section. In FIG. 28, an n type base layer 2 is disposed atop a p type emitter layer 1 so as to form a pn junction $J_1$ at its interface with the p type emitter layer 1. Provided in the top central portion of the n type base layer 2 is a p type base layer 3 which consists of a relatively heavily doped p+ type region $3a$ and a p type region $3b$. The p+ type region $3a$ is centered in the p type base layer 3 and surrounded by the p type region $3b$. The n type base layer 2 and the p type base layer 3 abut at a pn junction $J_2$ therebetween.

A ring shaped emitter layer 4 of n type material is selectively provided in an upper portion of the p type base layer 3. A portion of the top surface of the n type emitter layer 4 and an adjacent surface of the p+ type region $3a$ serve as a cathode surface 5. A pn junction $J_3$ is formed at an interface between the p type base layer 3 and the n type emitter layer 4.

At its top surface, the p type region $3b$ includes a channel region CH. A gate oxide film 6 overlies the channel region CH and a region around the same. A gate electrode 7 is buried in the gate oxide film 6 and electrically connected to an external gate electrode G.

A cathode electrode 8 is disposed over the gate oxide film 6 as well as the cathode surface 5. This allows that the p type base layer 3 and the n type emitter layer 4 are in electrical contact with each other through the cathode electrode 8. However, the gate electrode 7 and the cathode electrode 8 are insulated from each other by the intervening gate oxide film 6. The cathode electrode 8 is electrically connected to an external cathode electrode K.

A bottom surface of the p type emitter layer 1 is an anode surface 9. An anode electrode 10 entirely covers the anode surface 9, thereby ensuring electrical contact between the p type emitter layer 1 and the anode electrode 10. The anode electrode 10 is connected to an external anode electrode A.

Behavior of the IGT unit cell 100 as above is as follows.

With a higher potential at the anode electrode 10 than the cathode electrode 8 while keeping the gate electrode 7 in a floating state, the pn junction $J_2$ is reversely biased. Hence, no current flow would be generated between the anode electrode 10 and the cathode electrode 8.

An alternate case is where the anode electrode 10 is at a higher potential than the cathode electrode 8 and the gate electrode 7 is at a higher potential than the cathode electrode 8. With the p type region $3b$ being in electrical contact with the cathode electrode 8 via the p+ type region $3a$ while being coupled with the gate electrode 7 through the intervening gate oxide film 6, carrier charge storage occurs in the gate electrode 7 and the channel region CH and a channel is established in that region. The channel short circuits the n type base layer 2 to the n type emitter layer 4, initiating current flow between the anode electrode 10 and the cathode electrode 8. Thus, the unit cell 100 turns on.

If the gate voltage is removed in this on-state, the stored charge in the channel region CH is discharged, causing a exponential-like fall-off in a potential level around the channel region CH. As a result, the channel which has been short circuiting the n type base layer 2 and the n type emitter layer 4 disppears. Since the pn junction $J_2$ is reverse biased, the disappearance of the channel blocks the current flow between the anode electrode 10 and the cathode electrode 8. This is the turn-off behavior of the unit cell 100.

An IGT pellet is constituted by connecting a plurality of (e.g., thousands of) the unit cells 100 parrallel in a matrix (FIG. 29). On the IGT pellet, the gate electrode 7, the cathode electrode 8 and the anode electrode 10 of one unit cell 100 are electrically connected to respective corresponding electrodes of an adjacent unit cell 100.

The gate electrodes 7 of the unit cells 100 are wire bonded with the external gate electrode G by aluminium or other wires (not shown). The anode electrodes 10 are brazed to the external anode electrode A.

Likewise, the cathode electrodes 8 are wipe bonded with the external cathode electrode K by aluminium or other wires.

The conventional MOS device requires that the cathode electrodes 8 and the external cathode electrode K are wire bonded to obtain electrical contact therebetween. However, as known in the art, a self-cooling capability of the cells is less excellent than where the electrical contact between the electrodes is ensured by pressure contact method (pressure contact structure).

FIG. 31 shows a portion, precisely around one unit cell 100, of the IGT pellet of FIG. 29 as adopting the pressure contact structure. In FIG. 31, a cathode electrode body 15 and the cathode electrode 8 are in pressure contact, thereby ensuring electrical conduction therebetween. In more details, the cathode electrode 8 consists of a recess portion $8a$ and a projecting portion $8b$, the recess portion $8a$ being located directly on the cathode surface 5 and the projecting portion $8b$ being offset from the cathode surface 5 and overlying the gate oxide film 6. The cathode electrode body 15 is in pressure contact with the cathode electrode 8 only at the projecting portion $8b$.

By pressure contacting the anode electrode 10 and an anode electrode body 17, electrical conduction therebetween is attained. This makes improvement possible in the self-cooling capability of the IGT pellet to dissipate heat developed in the same from the anode and the cathode electrodes 10 and 8.

Despite the enhanced the self-cooling capability, the conventional IGT has two problems.

The first problem stems from the direct pressure contact between the cathode electrode body 15 and the projecting portion $8b$ of the cathode electrode 8, this structure aiming at contacting the electrode bodies 15 and 17 and the electrodes 8 and 10, respectively. The gate oxide film 6 and the gate electrode 7 under the projecting portion 8b are films made of material such as silicon dioxide and polycrystalline silicon which are easily destroyed by mechanical stress. The state of the art MOS fabrication approach, however, still has a difficulty in controlling the gate oxide film 6 and the gate electrode 7 as to the uniformity in their thicknesses. Hence, when the cathode electrode body 15 and the electrode 8 are pressed against each other, the gate oxide film 6 and the gate electrode 7 are also subjected to the stress through the projecting portion 8b but only unevenly, and often deformed or destroyed. If this happens, the IGT pellet malfunctions.

The second problem relates to switching speed. To understand the second problem, the turn-on behavior of one IGT unit cell 100 will be described in detail. First, a control voltage $V_G$ is impressed on the external gate electrode G, causing charge storage in the gate electrode 7, and hence, increase in a potential V at the gate electrode 7. FIG. 30 is a graph plotting the increase in the potential V. The graph shows that with the control voltage $V_G$ impressed on the external gate electrode G at the time $T_0$, the potential V at the gate electrode 7 rises exponentionally almost up to the control voltage $V_G$. The upward curve of the voltage rise is expressed as:

$$V = V_G \times \{1 - exp(-t/\tau)\} \quad (1)$$

where $\tau$ is time constant.

Now, assume that a threshold value of the potential V for creating the channel is $V_{th}$, creation of the channel is completed in a time $t_0$ after the control voltage $V_G$ was given to the external gate electrode G. In other words, the unit cell 100 turns on with time delay of $t_0$ from the start of the gate voltage application. For high speed switching, the time duration $t_0$ needs to be reduced. To reduce the time duration $t_0$, the time constant $\tau$ must be small.

Since that the time constant $\tau$ is given as $$\tau = C_{iss} \times R_g \quad (2)$$

where $C_{iss}$ is an input capacitance and $R_g$ is a gate resistance of the unit cell 100, reduction in either the input capacitance $C_{iss}$ or the gate resistance $R_g$ lowers the time constant $\tau$. The gate resistance $R_g$ herein defined is a resistance between the external gate electrode G and the gate electrode 7. The input capacitance $C_{iss}$ is a sum of a capacitance $C_1$ between the gate electrode 7 and the cathode electrode 8, a capacitance $C_2$ between the gate electrode 7 and the n type emitter layer 4, a capacitance $C_3$ between the gate electrode 7 and the p type base layer 3 and a capacitance $C_4$ between the gate electrode 7 and the n type base layer 2 (FIG. 32). In short, the input capacitance $C_{iss}$ is given as:

$$C_{iss} = C_1 + C_2 + C_3 + C_4 \quad (3)$$

The gate oxide film 6, which intervenes the gate electrode 7 and the cathode electrode 8, is usually formed by a silicon dioxide film to the thickness of about 1 μm. Hence, the capacitance $C_1$ per unit area is around 3.5 nF/cm². Considering that the electrodes 7 and 8 share a large contacting area, the capacitance $C_1$ accounts for a noneligible amount of the overall capacitance $C_{iss}$. This large influence of the capacitance $C_1$ may explain why success of the various past efforts to reduce the capacitances $C_2$ and $C_4$ is yet to be seen. Enough small time constant $\tau$, and hence, satisfactory improvement in switching speed have not been achieved.

Thus, the conventional IGTs are faced with these two problems. However, other MOS semiconductor devices are no exception in this regard.

SUMMARY OF THE INVENTION

According to a first aspect of the present invention, a MOS semiconductor device comprises: (a) a first conductivity type first semiconductor layer; (b) a second conductivity type second semiconductor layer selectively formed in a top major surface of the first semiconductor layer, the second semiconductor layer including (b-1) a first portion projecting higher than the top major surface of the first semiconductor layer, the first portion being partially exposed in a top surface thereof and (b-2) a second portion circumscribing the first portion, the second portion intercepting the top major surface of the first semiconductor layer; (c) a first conductivity type third semiconductor layer selectively formed in a top surface of the second semiconductor layer, the third semiconductor layer including a first portion and a second portion, the first portion of the third semiconductor layer intercepting a top surface of the first portion of the second semiconductor layer, the second portion of the third semiconductor layer intercepting a top surface of the second portion of the second semiconductor layer; (d) an insulation film disposed over the first semiconductor layer, the second portion of the second semiconductor layer and the second portion of the third semiconductor layer; (e) a control electrode disposed within the insulation film; (f) a first main electrode layer disposed at least over the first portions of the second and the third semiconductor layers; and (g) a second main electrode layer disposed in electrical contact with a bottom major surface of the first semiconductor layer.

Preferably, the MOS semiconductor device further comprises: a first external electrode disposed on the first main electrode layer; a second external electrode disposed on the second main electrode layer; and a distortion snubbering plate interposed between the first main electrode layer and the first external electrode, the distortion snubbering plate having an expansion coefficient ranging between a first expansion coefficient of material of the first to the third semiconductor layers and a second expansion coefficient of material of the first external electrode.

The first main electrode layer may also be disposed over the insulation film.

The second main electrode layer may include (g-1) a second conductivity type fourth semiconductor layer disposed on the bottom major surface of the first semiconductor layer; and (g-2) a conductive body disposed on the fourth semiconductor layer.

Thus, according to the first aspect, pressure contact of the external electrode and the first main electrode layer does not allow stress to be transmitted to the control electrode and the overlying insulation film since the main electrode layer has the highest surface at a portion over the first portion of the second semiconductor layer.

Moreover, by interposing the distortion snubbering plate between the first external electrode and the first main electrode, it is possible to ease lateral stress onto the control electrode and the insulation film which is caused by a difference in expansion coefficient between the material of the semiconductor layers and the material of the first external electrode.

In a second aspect of the present invention, a MOS semiconductor device comprises: (a) a first conductivity type first semiconductor layer; (b) a second conductivity type second semiconductor layer selectively formed in a top major surface of the first semiconductor layer, the second semiconductor layer intercepting the top major surface of the first semiconductor layer; (c) a third semiconductor layer selectively formed within a boundary of the second semiconductor layer, the third semiconductor layer intercepting a top surface of the second semiconductor layer; (d) an insulation film covering first exposed surfaces of the first to the third semiconductor layers; (e) a control electrode disposed within the insulation film; (f) a first main electrode layer covering only second exposed areas of the second and the third semiconductor layers or alternatively the second exposed areas and a portion of the insulation film, the second exposed areas of the second and the third semiconductor layers being spaced from the first exposed areas of the second and the third semiconductor layers, respectively; and (g) a second main electrode layer disposed in electrical contact with a bottom major surface of the first semiconductor layer.

Preferably, the first and the second exposed areas are spaced from each other by an air space gap.

The second main electrode layer may include: (g-1) a second conductivity type fourth semiconductor layer disposed on the bottom major surface of the first semiconductor layer; and (g-2) a conductive body disposed on the fourth semiconductor layer.

Thus, the first main electrode layer is substantially or completely spaced from the insulation film covering the control electrode. Hence, the capacitance between the first main electrode layer and the control electrode is drastically reduced.

In a third aspect of the present invention, a MOS semiconductor device includes a plurality of MOS unit cell structures arranged on a top major surface of a first conductive type first semiconductor layer. Each MOS unit cell structure comprises: (a) a second conductive type second semiconductor layer intercepting the top major surface of the first semiconductor layer; (b) a plurality of third semiconductor layers selectively formed within a boundary of the second semiconductor layer, the plurality of third semiconductor layers each intercepting a top surface of the second semiconductor layer; (c) an insulation film covering first exposed surfaces of the first to the third semiconductor layers; (d) a control electrode disposed within the insulation film; (e) a first main electrode layer covering second exposed surfaces of the second and the third semiconductor layers, the second exposed surfaces of the second and the third semiconductor layers being spaced from the first exposed surfaces of the second and the third semiconductor layers, respectively; and (f) a second main electrode layer disposed in electrical contact with a bottom major surface of the first semiconductor layer. In each unit cell, the first major electrode layers of the plurality of MOS unit cell structures taken as a whole are an electrode pattern of a comb-like configuration, each one of the first major electrode layers corresponding to a tooth of the comb-like configuration. The insulation films of the plurality of MOS unit cell structures taken as a whole are an insulation film pattern of a comb-like configuration, each one of insulation films corresponding to a tooth of the comb-like configuration. The electrode pattern and the insulation film pattern are laterally interdigitated.

Thus, the first main electrode layers taken as a whole have the comb-like shape and the insulation films covering the control electrodes taken as a whole similarly have the comb-like shape. The two comb-like elements are disposed laterally interdigitated, which allows that the first main electrode layers and the control electrodes of the respective unit cells are connected to the external electrode. Hence, the capacitance between the first main electrode layers and the control electrodes is drastically reduced.

In a fourth aspect of the present invention, a MOS semiconductor device, comprises: (a) a first conductivity type first semiconductor layer; (b) a second conductivity type second semiconductor layer selectively formed in a top major surface of the first semiconductor layer, the second semiconductor layer intercepting the top major surface of the first semiconductor layer; (c) a first conductivity type third semiconductor layer selectively formed within a boundary of the second semiconductor layer, the third semiconductor layer intercepting a top surface of the second semiconductor layer; (d) an insulation film covering first exposed surfaces of the first to the third semiconductor layers; (e) a control electrode disposed within the insulation film; (f) a first main electrode layer covering only second exposed surfaces of the second and the third semiconductor layers or alternatively the second exposed surfaces and a portion of the insulation film, the second exposed surfaces of the second and the third semiconductor layers being spaced from the first exposed surfaces of the second and the third semiconductor layers, respectively; and (g) a second main electrode layer disposed in electrical contact with a bottom major surface of the first semiconductor layer. The MOS device is characterized in that the first main electrode layer is partially higher at a portion overlying the second exposed surfaces than a surface of the insulation film.

Preferably, the MOS semiconductor device further comprises: a first external electrode disposed on the first main electrode layer; a second external electrode disposed on the second main electrode layer; and a distortion snubbering plate interposed between the first main electrode layer and the first external electrode, the distortion snubbering plate having an expansion coefficient ranging between a first expansion coefficient of material of the first to the third semiconductor layers and a second expansion coefficient of material of the first external electrode.

The first main electrode layer may be thicker than the insulation film.

The first main electrode layer may also be disposed over the insulation film.

Thus, in the fourth aspect, the first main electrode is not only substantially or completely separated from the insulation film, but also higher than the insulation film. This greatly reduces the capacitance between the first main electrode and the control electrode. Further, pressure contact of the first main electrode and the external electrode does not result in the pressure transmitted to the control electrode and the overlying insulation film.

Further, if the distortion snubbering plate is inserted between the first external electrode and the first main electrode, it is possible to ease lateral stress onto the control electrode and the insulation film which is caused by a difference in expansion coefficient between the material of the semiconductor layers and the material of the first external electrode.

According to a fifth aspect of the present invention, a MOS semiconductor device comprises the elements (a) to (g) of the MOS device of the fourth aspect, and is characterized in that the second and the third semiconductor layers each have a projecting portion protruding higher than the top major surface of the first semiconductor layer. In addition, at least a portion of the second exposed surface of the second semiconductor layer and the second exposed surface of the third semiconductor layer are within a top surface of the projecting portion.

Preferably, the MOS semiconductor device further comprises: a first external electrode disposed on the first main electrode layer; a second external electrode disposed on the second main electrode layer; and a distortion snubbering plate interposed between the first main electrode layer and the first external electrode, the distortion snubbering plate having an expansion coefficient ranging between a first expansion coefficient of material of the first to the third semiconductor layers and a second expansion coefficient of material of the first external electrode.

The first main electrode layer may be disposed exclusively on the top surface of the projecting portion.

Thus, in the fifth aspect, the multi-layer semiconductor structure includes the projecting portion under the first main electrode layer, thereby allowing that the first main electrode layer is higher than the insulation film. Hence, the device structure described in relation to the fourth aspect is obtainable without thickening the first main electrode layer.

Moreover, by interposing the distortion snubbering plate between the first external electrode and the first main electrode, it is possible to ease lateral stress onto the control electrode and the insulation film which is caused by a difference in expansion coefficient between the material of the semiconductor layers and the material of the first external electrode.

The present invention also relates to a method of fabricating a MOS semiconductor device. In one aspect, the method comprises the steps of: (a) selectively forming a first portion of a second conductivity type second semiconductor layer in a top major surface of a first conductivity type first semiconductor layer; (b) locally etching the first semiconductor layer at the top major surface so that the top major surface of the first semiconductor layer is finished into a recessed surface which is lower than the first portion of the second semiconductor layer; (c) selectively forming a first insulation film on the recessed surface; (d) forming a control electrode layer on the first insulation film; (e) selectively doping the first semiconductor layer using the control electrode layer as a mask and selectively forming under the recessed surface a second portion of the second semiconductor layer, the second portion being contiguous to the first portion; (f) selectively doping the first and the second portions of the second semiconductor layer and forming a first conductivity type third semiconductor layer which extends from the first .portion to the second portion of the second semiconductor layer; (g) covering the control electrode layer with a second insulation film; (h) forming a first main electrode layer entirely on a structure fabricated up to the step (g) from the step (a); and (i) forming a second main electrode layer in electrical contact with a bottom major surface of the first semiconductor layer.

Preferably, the method further comprises the step of (j) forming a second conductivity type fourth semiconductor layer below the bottom major surface of the first semiconductor layer.

The method may further comprising the step of (j) etching the first main electrode layer, at least at a portion overlying the second insulation film, thereby patterning the first main electrode layer.

In another aspect, a method of fabricating a MOS semiconductor device comprises the steps of: (a) selectively forming a first portion of a second conductivity type second semiconductor layer in a top major surface of a first conductivity type first semiconductor layer; (b) selectively covering an exposed surface of the first semiconductor layer with a first insulation film; (c) forming a control electrode layer on the first insulation film; (d) selectively doping the first semiconductor layer and the first portion of the second semiconductor layer using the control electrode layer as a mask and forming a second portion of the second semiconductor layer selectively in the first semiconductor layer, the first and the second portions being contiguous to each other and parallel to the top major surface of the first semiconductor layer; (e) forming a masking layer which partially covers an exposed surface of the first portion of the second semiconductor layer; (f) selectively doping the second semiconductor layer using the control electrode layer and the masking layer as a mask and forming a first conductivity type third semiconductor layer selectively within the first and the second portions of the second semiconductor layer; (g) removing the masking layer; (h) covering the control electrode layer with a second insulation film; (i) forming a first main electrode layer entirely on a structure fabricated up to the step (h) from the step (a); (j) forming a second main electrode layer in electrical contact with a bottom major surface of the first semiconductor layer; and (k) etching the first main electrode layer at least at a portion overlying the second insulation film, thereby patterning the first main electrode layer.

The method may further comprises the step of (l) forming a second conductivity type fourth semiconductor layer below the bottom major surface of the first semiconductor layer.

The semiconductor devices of the respective aspects which yield the abovementioned meritorious effects are obtainable by these methods. The methods are particularly suitable to fabricate the semiconductor devices of the first, the second and the fourth aspects.

Accordingly, a first object of the present invention is to obtain a pressure contact type MOS semiconductor device which prevents damage to a control electrode layer and an overlying insulation film.

A second object of the present invention is to obtain a MOS semiconductor device having a reduced input capacitance and hence improved switching characteristics.

A third object of the present invention is to obtain a MOS semiconductor device which includes a plurality of MOS unit cells arranged therein and which has a reduced input capacitance and hence improved switching characteristics.

A fourth object of the present invention is to obtain a pressure contact type MOS semiconductor device which prevents damage to a control electrode layer and an overlying insulation film and which has a reduced input capacitance and hence improved switching characteristics.

A fifth object of the present invention is to offer fabrication methods of the MOS semiconductor devices designed to meet the first, the second, the third or the fourth object.

These and other objects, features, aspects and advantages of the present invention will become more apparent from the following detailed description of the present invention when taken in conjunction with the accompanying drawings.

BRIEF DESCRIPTION OF THE DRAWINGS

FIG. 30 is a graph showing change in a gate potential at the device turn-on;

DESCRIPTION OF THE PREFERRED EMBODIMENTS

A. Structure and Characteristics of First Preferred Embodiment

Figure 1:
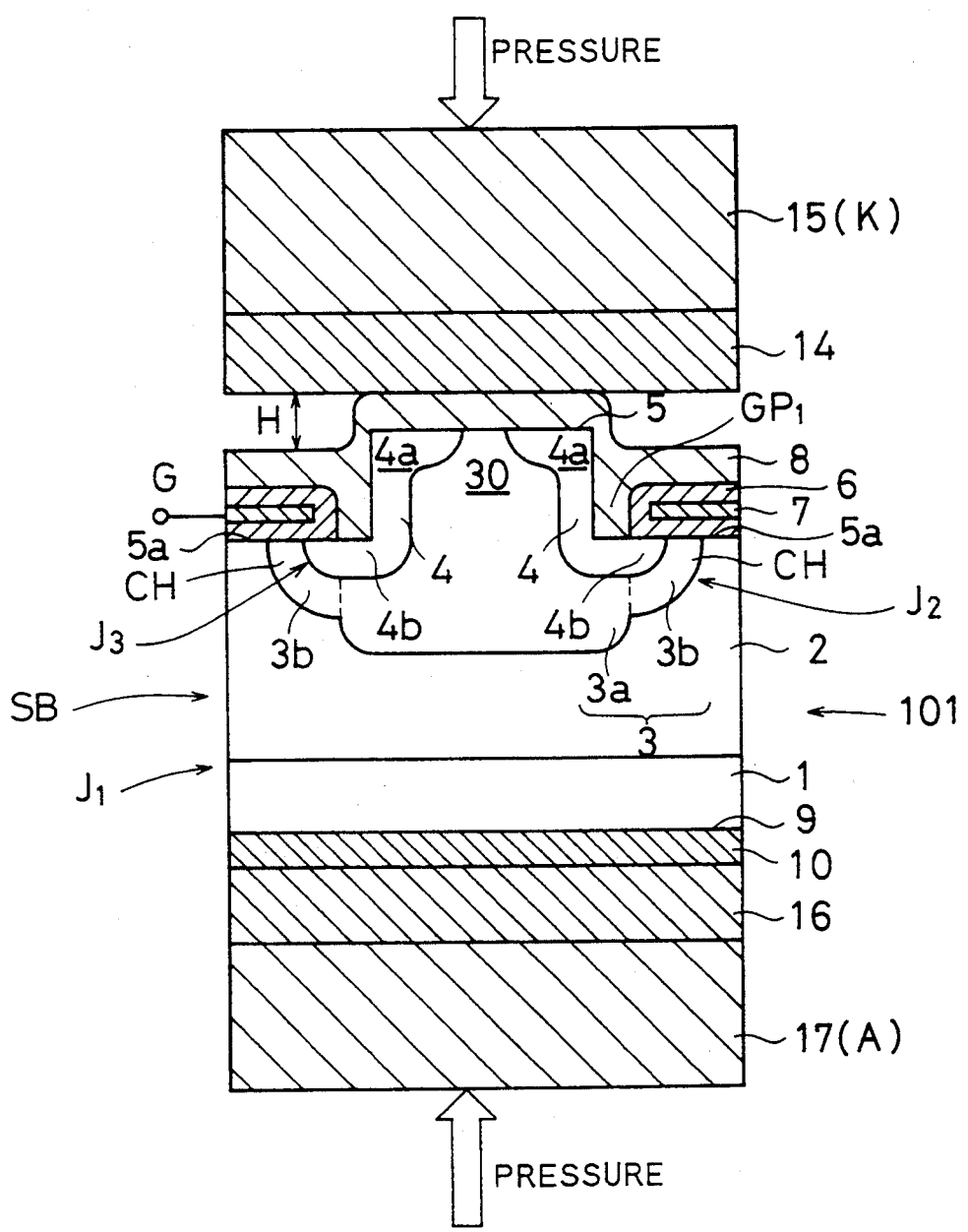
FIG. 1 is a cross sectional view of an IGT unit cell according to a first preferred embodiment of the present invention.

FIG. 1 shows a cross section of an IGT unit cell 101 according to a first preferred embodiment of the present invention. The unit cell 101 is designed in a configuration that achieves the first object of the present invention.

As shown in FIG. 1, the unit cell 101 includes a semiconductor body SB and two structures sandwiching the same. Silicon is used for a base member of the semiconductor body SB. The semiconductor body SB includes a p type emitter layer 1. An n type base layer 2 is formed on the p type emitter layer 1. A p type base layer 3 is disposed in an upper portion within the boundary of the n type base layer 2. The p type base layer 3 consists of a relatively heavily doped region 3a of p+ type material and a p type region 3b. The p+ type region 3a is centered in the p type base layer 3 and laterally surrounded by the p type region 3b. While the top surfaces of the p type region 3b and the n type base layer 2 are flush with each other, the p+ type region 3a partially projects higher and includes a projection 30 in that region. The n type base layer 2 has a pn junction $J_1$ at an interface with the p type emitter layer 1 and a pn junction $J_2$ at an interface with the p type base layer 3.

The p type base layer 3 selectively includes in its upper portion an n type emitter layer 4, a contour of which intercepts the top surface of the p type base layer 3 in the shape of a rectangular ring. The n type emitter layer 4 overlies the p type region 3b and the p+ type region 3a, and consists of a first region 4a located in the projection 30 and a second region 4b located in the p type region 3b. An interface between the p type base layer 3 and the n type emitter layer 4 is an pn junction $J_3$.

The topmost surface of the semiconductor body SB functions as a cathode surface 5. The cathode surface 5 includes a recessed surface 5a which surrounds the projection 30 and which is offset lower from the top surface of the projection 30. In the recessed surface 5a, the second region 4b of the n type emitter 4, the p type region 3b and the n type base layer 2 are exposed. A difference in height between the top surfaces of the cathode surface 5 and the recessed surface 5a is sufficient to provide clearance, for example, 5 μm. The p type region 3b includes a channel region CH at a portion directly under the recessed surface 5a.

A gate oxide film 6 is deposited on the recessed surface 5a. A gate electrode 7 is buried in the gate oxide film 6. The gate electrode 7 and the gate oxide film 6 overlie a portion of the second region 4b of the n type emitter layer 4, the channel region CH and the n type base layer 2 which intercept the recessed surface 5a. Due to the gate oxide film 6, electrical insulation between the respective elements of the semiconductor body SB and the gate electrode 7 is guaranteed. The projection 30 and the gate oxide film 6 are spaced from each other by a gap $GP_1$ therebetween.

A cathode electrode layer 8 is disposed entirely across the semiconductor body SB and the gate oxide film 6. The cathode electrode 8 is in contact with the p+ region 3a and the n type emitter layer 4 at the top surface of the projection 30. Contact between the cathode electrode layer 8 and the n type emitter layer 4 is also present at side walls of the projection 30 and the bottom surface of the gap $GP_1$. Hence, the p type base layer 3 and the n type emitter layer 4 are electrically connected.

Due to the existence of the gate electrode 7 and the gate oxide film 6 on the recessed surface 5a, the surface height of the cathode electrode layer 8 stepwisely varies from a portion over the projection 30 to a portion above the recessed surface 5a. The difference in height H of the stepwise variation is smaller than the difference in height between the topmost area of the cathode surface 5 and the recessed surface 5a, specifically 1 to 2 μm, for instance.

A bottom surface of the p type emitter layer 1 is an anode surface 9. An anode electrode 10 is disposed across the anode surface 9, in electrical contact with the p type emitter layer 1.

Figure 28:
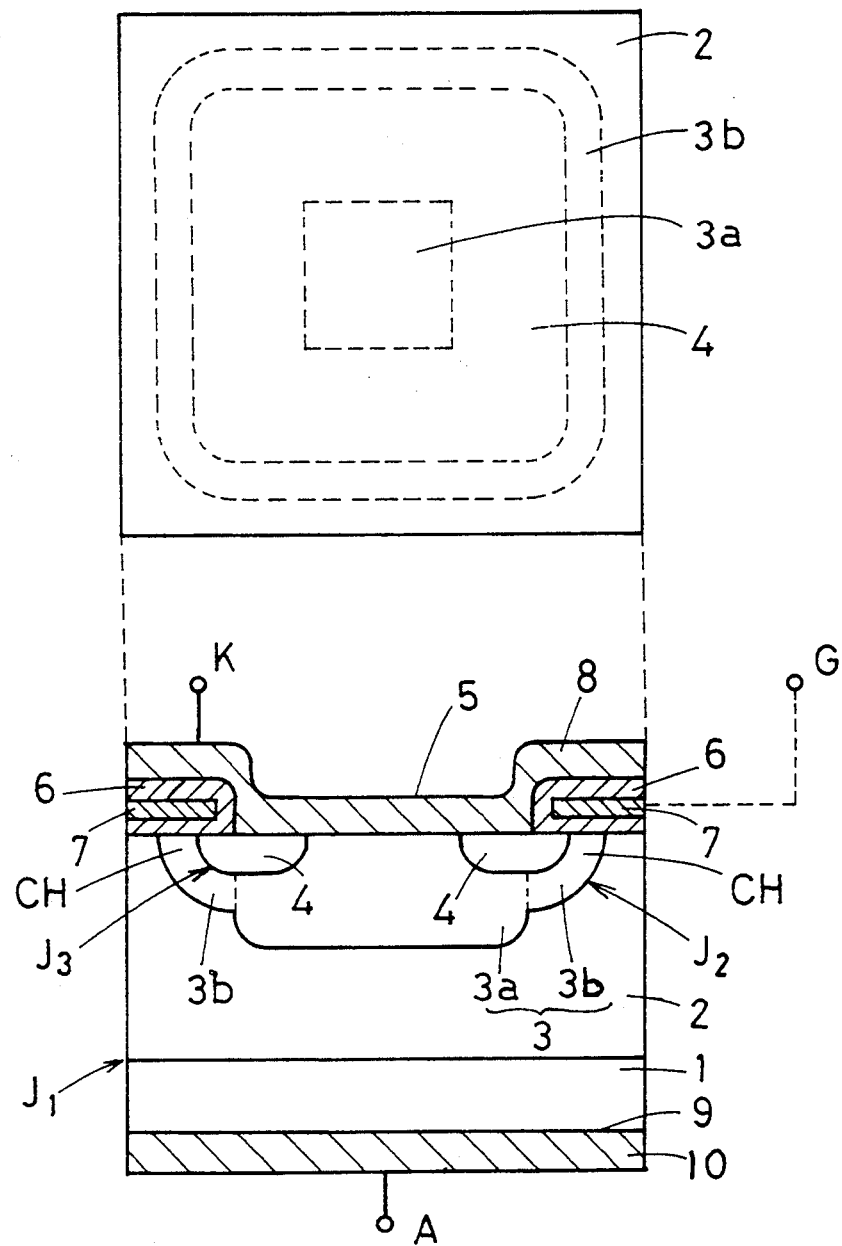
FIG. 28 shows a conventional IGT unit cell as viewed from above and in cross section.

The principles of the turn-on and turn-off control in the IGT unit cell 101 is the same as that in the conventional IGT unit cell 100 of FIG. 28. The unit cell 101 turns on with a higher potential at the anode electrode 10 than the cathode electrode 8 and a higher potential at the gate electrode 7 than the cathode electrode 8. The unit cell 101 turns off in response to removal of a gate voltage.

On the IGT pellet, a plurality of the IGT unit cells 101 are joined parallel in a matrix and integrated into one unit. The gate electrodes 7 of adjacent cells are electrically connected to each other on the IGT pellet and connected to an external gate electrode G. Likewise, the cathode electrodes 8 of adjacent cells are joined and continuous. The anode electrodes 10 of the unit cells 101 are contiguous to each other.

For actual use of the IGT pellet including the unit cells 101 thus connected with each other, a cathode distortion snubbering plate 14 and a cathode electrode body 15 are disposed on the cathode electrodes 8. The cathode electrode body 15 is made of copper and has an another function as an external cathode electrode K. The cathode distortion snubbering plate 14 is made of molybdenum and has a flat bottom surface.

An anode distortion snubbering plate 16 and an anode electrode body 17 are similarly disposed across the bottom surface of the anode electrodes 10. The anode electrode body 16 is a copper plate and has an additional function as an external anode electrode A. The anode distortion snubbering plate 17 is made of molybdenum.

The semiconductor body SB is pressured through the cathode and the anode electrode bodies 15 and 17, thereby maintaining electrical contact between the electrode bodies 15 and 17 and the semiconductor body SB. Heat developed in the semiconductor body SB is radiated from the cathode and the anode electrode bodies 15 and 17.

The cathode distortion snubbering plate 14 and the cathode electrode layer 8 are in contact only above the projection 30 but not in contact above the recessed surface 5a. This prevents transmission of stress to, and hence, deformation of or damage to the gate electrode 7 and the gate oxide film 6.

The reason of providing the cathode and the anode distortion snubbering plates 14 and 16 is as follows. The expansion coefficient of copper, the material for the cathode and the anode electrode bodies 15 and 17, is $16.5 \times 10^6 /°C$., and thus quite different from the expansion coefficient of silicon $3.1 \times 10^{-6}/°C$. Hence, if the cathode and the anode electrode bodies 15 and 17 directly pressure contact the IGT pellet, a result will be heat caused at device turn-on expanding the electrode bodies 15 and 17 and the semiconductor body SB differently. This in turn causes lateral stress to the unit cells 101, deforming the unit cells 101 even further. The distortion often adversely affects electrical characteristics of the gate oxide film 6 and the gate electrode 7. The same phenomena occurs during fall of the temperature of the IGT pellet after power supply to the IGT is cut.

However, the distortion of the unit cells 101 is minimum in the first preferred embodiment in which the distortion snubbering plates 14 and 16 intervene between the electrode and the semiconductor bodies. This is because the expansion coefficient of molybdenum $4.9 \times 10^{-6}/°C$. is approximately equal to that of silicon $3.1 \times 10^{-6}/°C$. In addition, the electrical connection between the electrode bodies 15 and 17 and the electrode layers 8 and 10 is not lost by the intervening distortion snubbering plates 14 and 16 because molybdenum is a conductive material.

The distortion snubbering plates 14 and 16 may alternatively be made of any other conductive material as far as the material has an expansion coefficient ranging between the expansion coefficients of silicon and copper. Still, the snubbering plates are optimally made of conductive material which has an approximately the same expansion coefficient as that of silicon. Tungusten, for instance, is a good alternative of molybdenum.

If it is not possible to employ both of the snubbering plates 14 and 16, either one may be omitted though not desired very much. The present invention is not limited to use where only the distortion snubbering plate 16 is provided, however, considering protection of the gate structure elements 6 and 7, the one to be provided is preferably the plate 14.

B. Fabrication Method of IGT of First Preferred Embodiment

FIGS. 9 to 17 are views of the IGT unit cell 101 of the first preferred embodiment during successive stages in the process of fabrication thereof.

Figure 9:
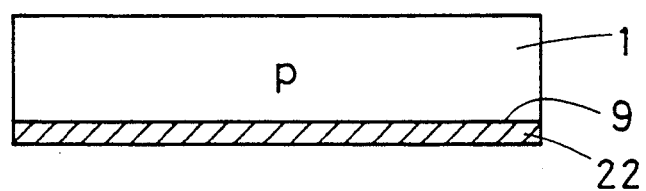
FIGS. 9 to 17 are cross sectional views showing fabrication process of the IGT unit cell of FIG. 1.
Figure 10:
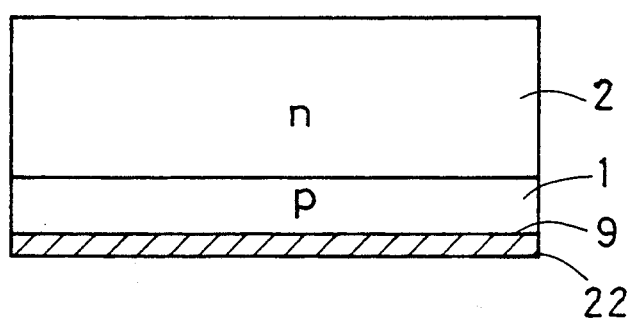

First stage is formation of an oxide film 22 on the bottom major surface (anode surface 9) of a relatively highly doped p type silicon substrate 1, which will become the p type emitter layer, as shown in FIG. 9. A relatively lightly doped n type silicon layer 2, which will become the n type base layer, is then epitaxially grown over the top major surface of the silicon substrate 1, thereby developing a two-layered pn-structure substrate (FIG. 10). In the epitaxial growth, The oxide film 22 acts to prevent epitaxial formation of another layer on the anode surface 9. The two-layer pn substrate may alternately be obtained by other method. One alternate approach is to diffuse p type impurities into a relatively lightly doped n type silicon substrate from one surface, thereby Growing a p type silicon layer of a relatively high impurity concentration on that surface. In another approach, a relatively lightly doped n type substrate and a relatively highly doped p type substrate each separately prepared are combined.

Figure 11:
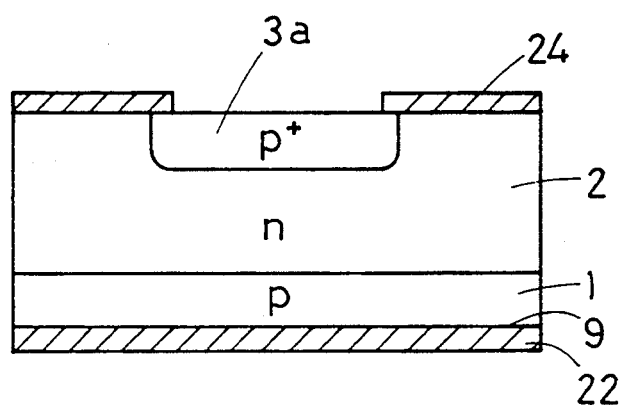
Figure 12:
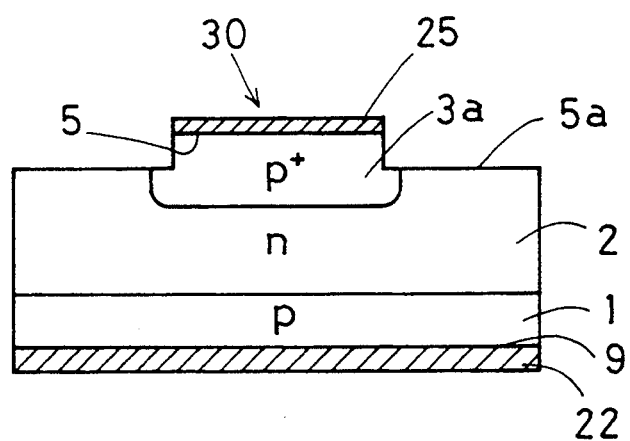

Next, an oxide film 24 is selectively disposed on the n type base layer 2 so that the resulting oxide film 24 includes an aperture through which the n type base layer 2 is locally doped and/or diffused p type in the region 3a (FIG. 11). Next, the oxide film 24 is removed and an oxide film 25 is selectively deposited on the p+ type region 3a. The p+ type region 3a is selectively etched using the oxide film 25 as a mask, whereby the projection 30 and the recessed surface 5a are established (FIG. 12). Thus, a portion of the surface of the p+ type region 3a immediately under the oxide film 25, i.e., the top surface of the projection 30 is defined as the cathode surface 5.

After removing the oxide film 25, an oxide film is grown entirely on the recessed surface 5a to a thickness of around 1000 angstrom. The oxide film is then covered with a polycrystalline silicon film.

Figure 13:
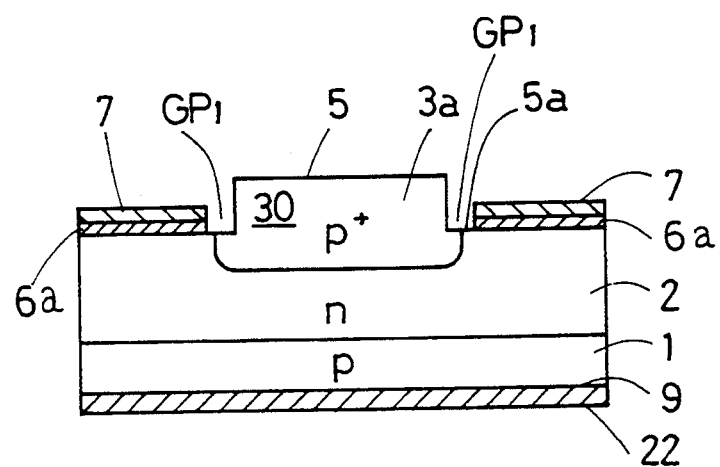

The oxide/silicon film combination is selectively removed by a conventional photolithographic process, thereby leaving on the recessed surface 5a a portion 6a of the gate oxide film 6 and the gate electrode 7 (FIG. 13). The portion 6a and the gate electrode 7 are spaced from the projection 30 by the gap $GP_1$.

Figure 14:
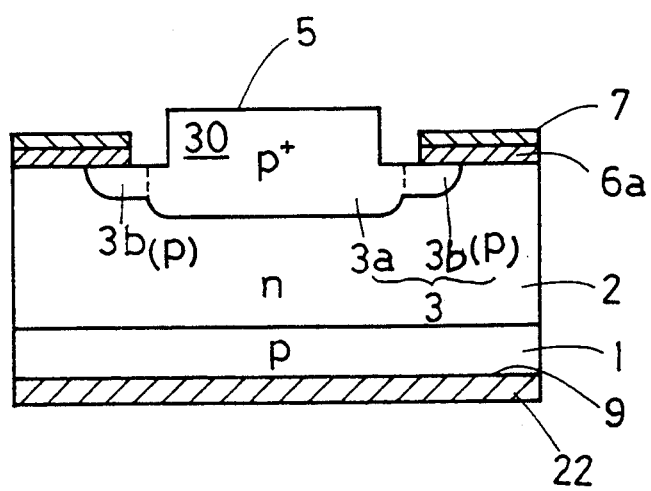

Masking the unit cell with the gate electrode 7, p type impurities are implanted and/or diffused in the n type base layer 2, to thereby drive the p type region 3b around the p+ type region 3a. The p type region 3b together with the p+ type region 3a forms the p type base layer 3 (FIG. 14).

Figure 15:
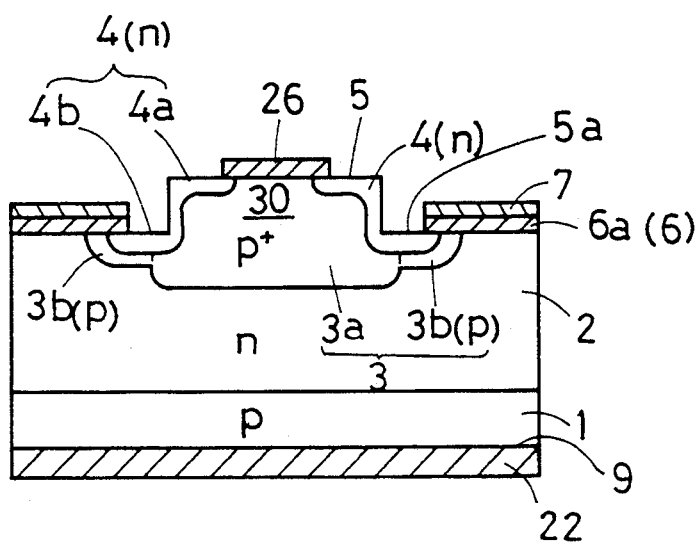

An oxide film 26 is then grown selectively on the top surface of the projection 30. Subsequently, n type dopants are implanted and/or diffused in the p type base layer 3 from the surface unmasked by the oxide film 26 and the gate electrode 7. As a result, the n type emitter layer 4 of relatively high impurity concentration is formed (FIG. 15). The n type emitter layer 4 includes the first region 4a and the second region 4b. The region 4a intercepting the top surface of the projection 30 while the region 4b intercepts the top surface of the p type region 3b.

Figure 16:
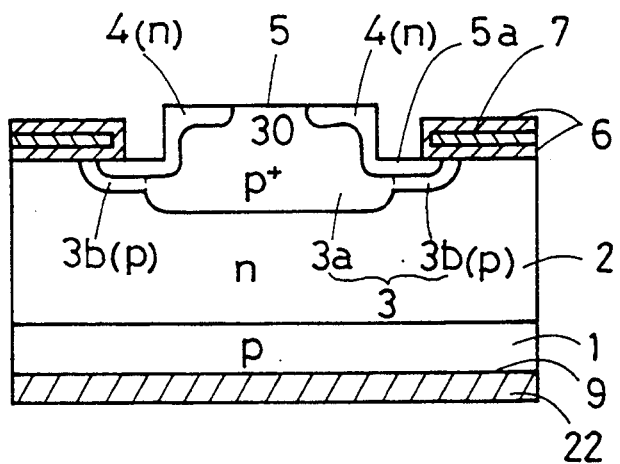
Figure 17:
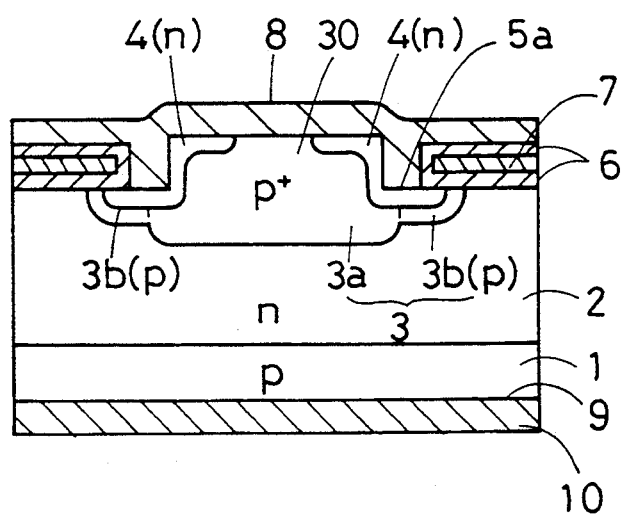

The electrode 7 is covered on the top and the side surfaces with an oxide film by a conventional photolithographic technique, whereby the gate oxide film 6 is completed (FIG. 16). The oxide film 22 is then removed, followed by formation of single- or multiple-layer alminium or other metal films, one across the cathode surface 5, the recessed surface 5a and the surface of the oxide film 6 and the other across the anode surface 9. As a result, the cathode and the anode electrodes 8 and 10 are formed (FIG. 17). The unit cell 101 as shown in FIG. 1 is thus complete.

Although the description above on the fabrication process is focused on only one unit cell 101, one skilled in the art will readily understand that all unit cells 101 on one pellet are fabricated simultaneously through the same process.

C. Structure and Characteristics of Second Preferred Embodiment

Figure 2:
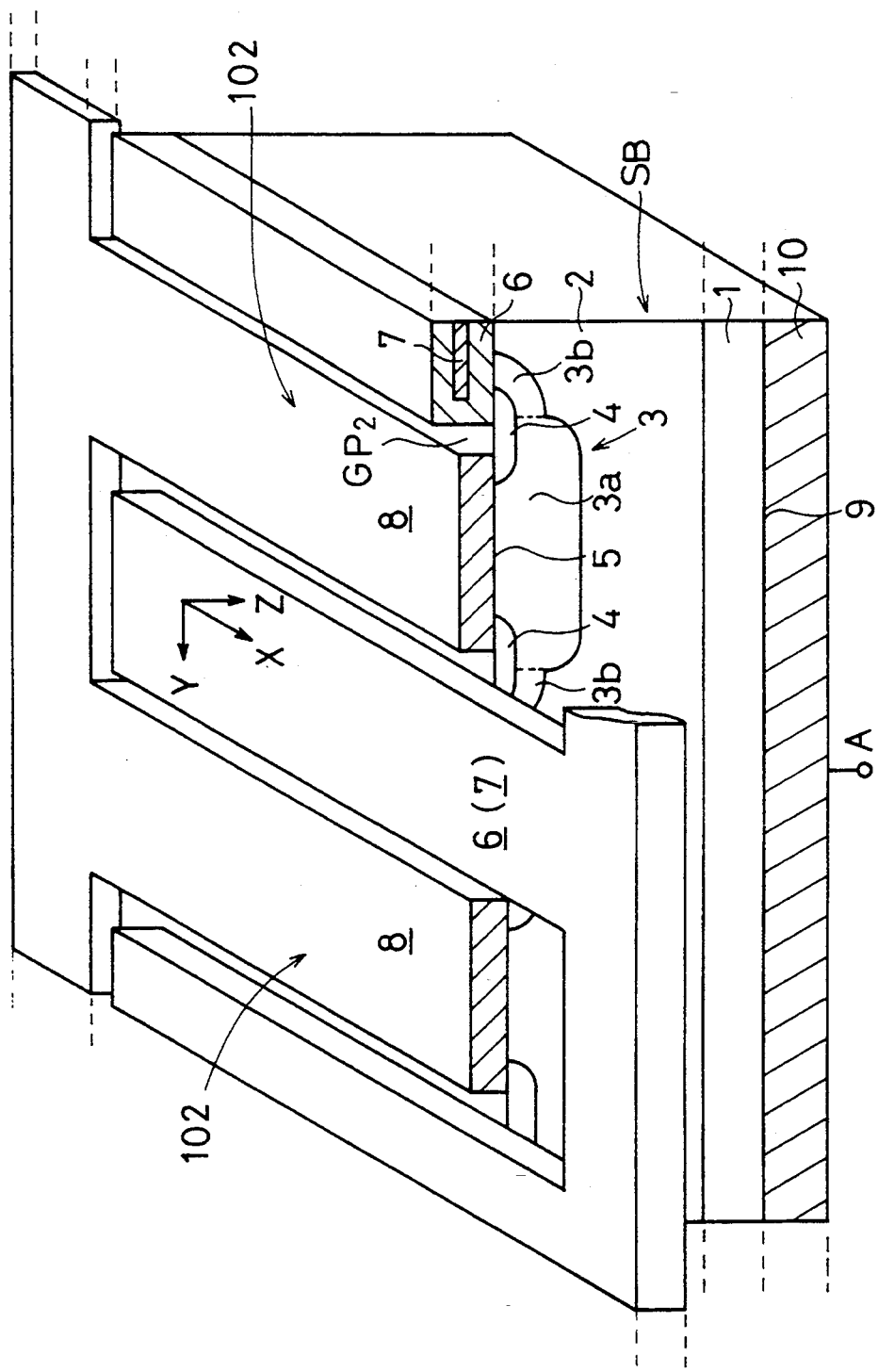
FIG. 2 is a cross sectional perspective view of an IGT pellet according to a second preferred embodiment of the present invention.
Figure 3:
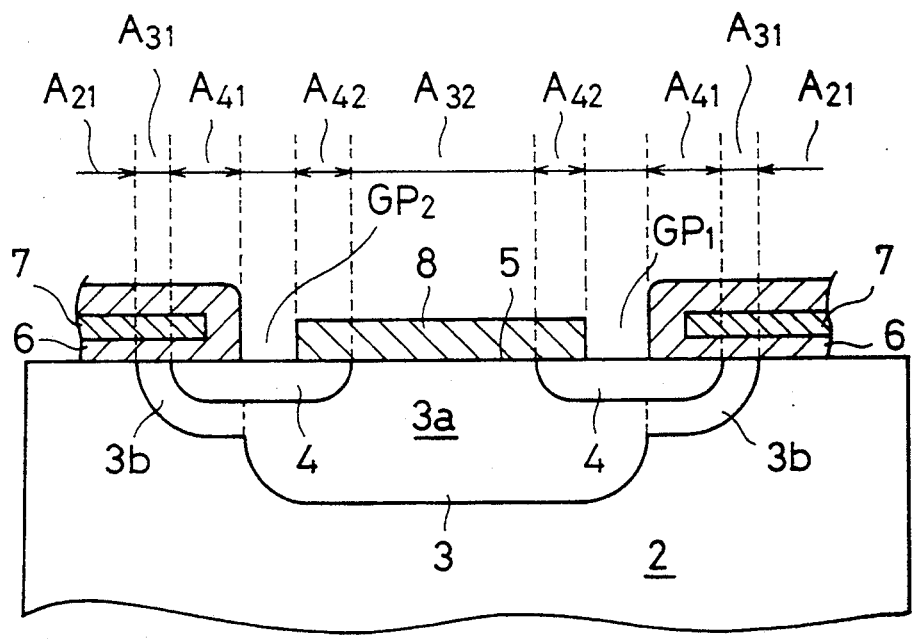
FIGS. 3 and 4 are explanatory diagrams showing exposed surfaces of semiconductor layers.

An IGT unit cell 101 according to a second preferred embodiment will be now described in relation to FIG. 2. The second preferred embodiment is intended to fullfill the second and the third objects of the present invention. FIG. 2 is a cross sectional view of an IGT pellet in perspective which includes a plurality of unit cells 102 of the second preferred embodiment. Each IGT unit cell 102 is rectangular-shaped, extending in a direction X and parallel to the top major surface of a semiconductor body SB. The unit cells 102 are juxtaposed in a direction Y which is perpendicular to the direction X. A p type emitter layer 1, an n type base layer 2 and an anode electrode 10 of one unit cell are each contiguous to a corresponding layer or substrate of an adjacent unit cell. The positional relation in a Y-Z plane between the p type emitter layer 1, the n type base layer 2, the p type base layer 3 and an n type emitter layer 4 is the same as that in the conventional unit cell 100 of FIG. 28. In a direction parallel to the top surface of the n type base layer 2, a p+ region 3a is surrounded by a p type region 3b. The semiconductor layers 2, 3 and 4 are exposed in first exposed surfaces $A_{21}$, $A_{31}$ and $A_{41}$ (FIG. 3) which are covered with a gate oxide film 6 and a Gate electrode 7.

Different from the conventional unit cell 100 of FIG. 28, the unit cell 102 includes the p type base layer 3 and the n type emitter layer 4 each shaped in a rectangular strip which has longer sides aligned with the direction X. Another distinction is a cathode electrode 8 which overlies the unit cell 102 not on the entire top surface of the cell but exclusively at the top surface of the p+ type region 3a, i.e., a second exposed surface $A_{32}$ of the p type base layer 3 and a second exposed surface $A_{42}$ of the n type emitter layer 4 (See FIG. 3). Thus, the cathode electrode 8 and the gate insulation film 6 are not in superimposed relation but spaced from each other by gaps $GP_1$, $GP_2$. The top surface of the cathode electrode 8 is lower than that of the gate insulation film 6.

In each unit cell 102, the cathode electrode 8 extends in the direction X. The cathode electrode 8 of one unit cell is contiguous at one end to that of adjacent unit cell.

Thus, the cathode electrodes 8 taken as a whole have a comb-like configuration in which each cathode electrode 8 of each unit cell 102 is a tooth of a comb. The comb-like configuration is adopted to join adjacent cathode electrodes 8. The gate electrodes 7 and the gate oxide films 6 in combination are shaped in a similar comb-like configuration. The gate electrode/oxide combination of each unit cell 102 is a tooth of a comb.

The two comb-like patterns are interdigitated in an X-Y plane.

Figure 29:
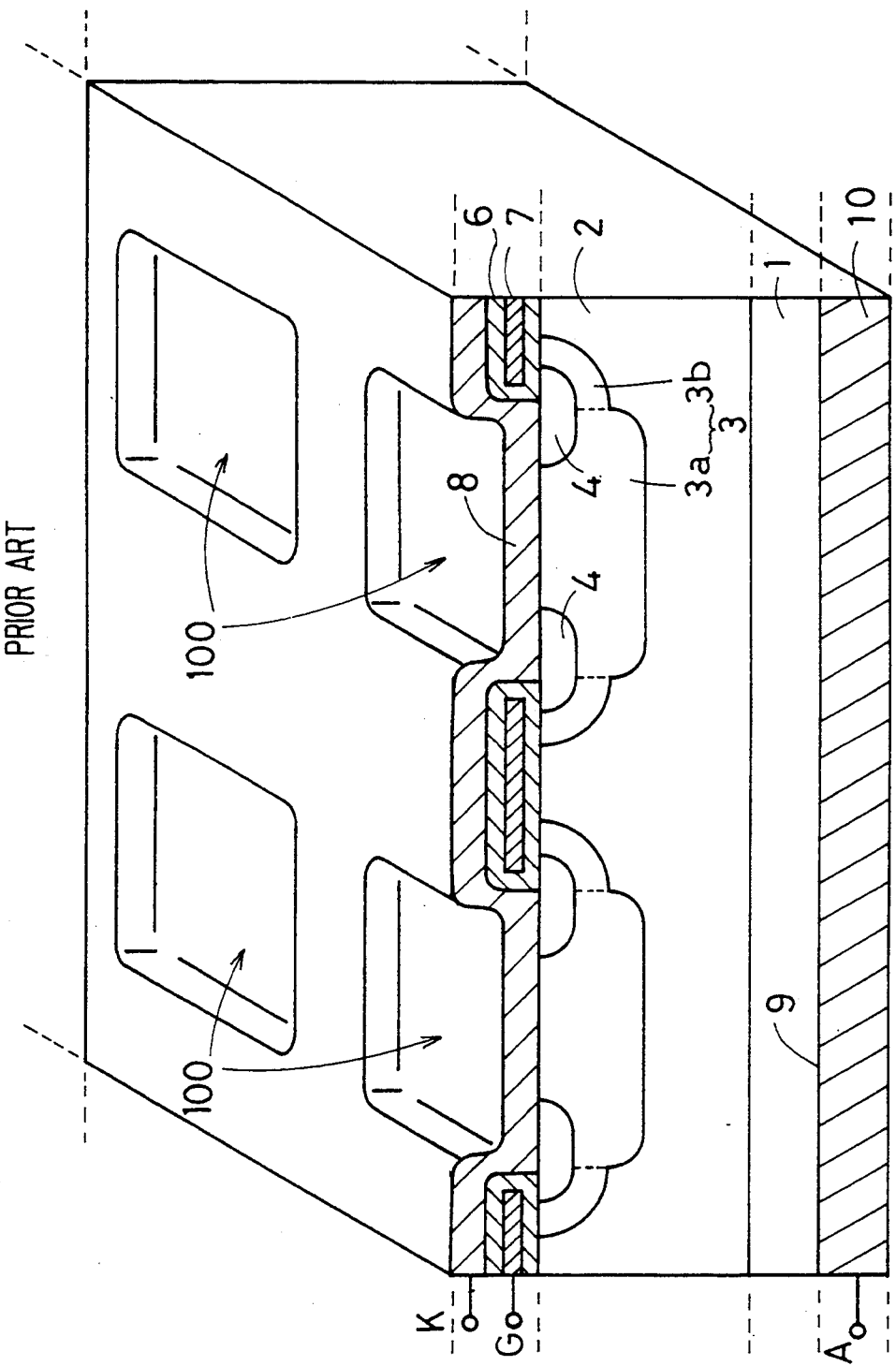
FIG. 29 is a cross sectional perspective view of the conventional IGT unit cell.
Figure 30:
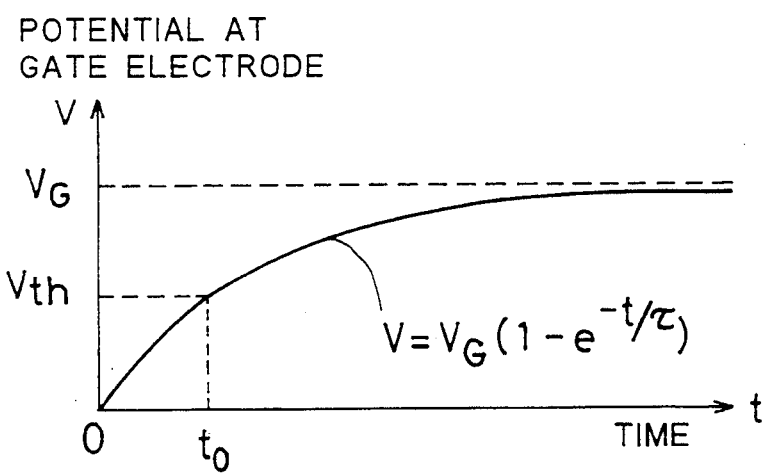

The reason for shaping the unit cells 102 each in a strip and the cathode electrodes 8 in a comb is as follows. Consider the unit cells 102 arranged in a matrix as shown in FIG. 29. If the cathode electrodes 8 are removed at a portion covering the gate oxide films 6, resulting cathode electrodes 8 will be separated from each other because each unit cell 102 is surrounded by the gate oxide film 6. In addition, since the top surface of the cathode electrodes 8 now disconnected from each other is lower than the top surface of the gate oxide film 6, even pressure contact would not guarantee connection between the cathode electrodes 8 and an external cathode electrode.

In each unit cell 102 of the second preferred embodiment, however, the cathode electrode 8 is not surrounded by the gate oxide film 6. Hence, the cathode electrodes 8 are contiguous to each other without overlying the gate oxide films 6. The second preferred embodiment requires that the IGT pellet including the unit cells 102 is wire bonded to external electrodes.

Figure 31:
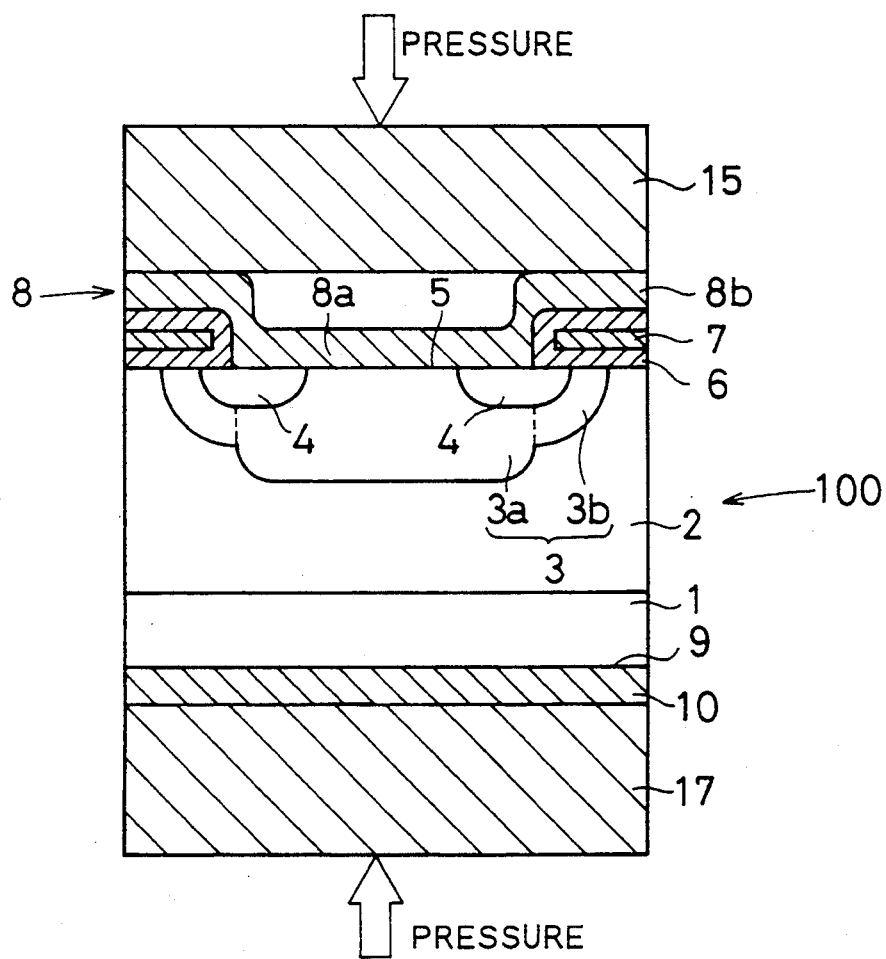
FIG. 31 is a cross sectional view of the conventional IGT unit cell as finished in pressure contact.
Figure 32:
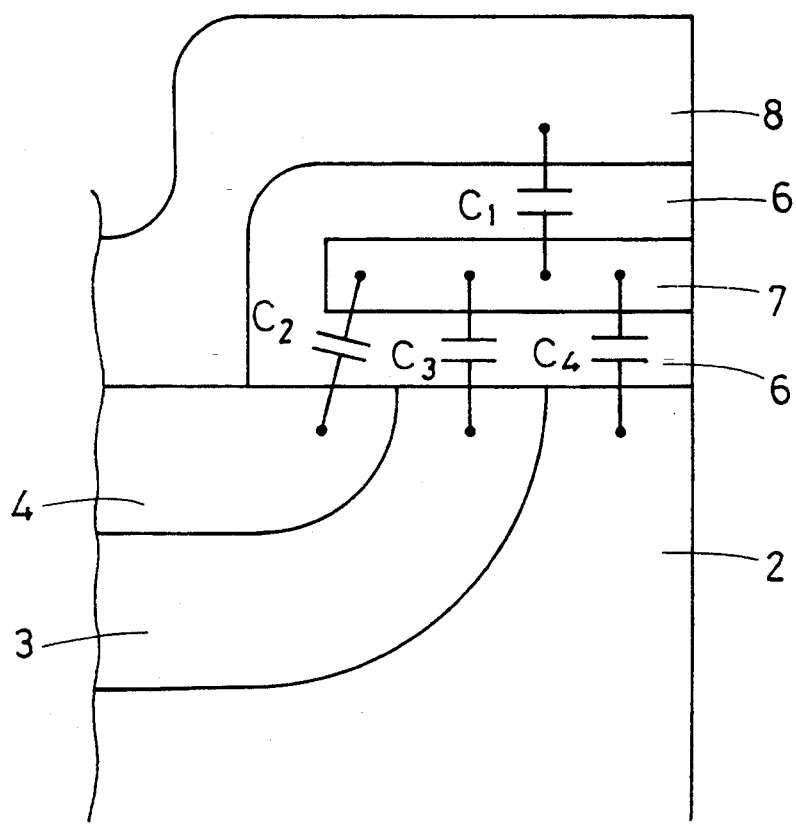
FIG. 32 is an enlarged view of a gate electrode and an adjacent portion of the conventional IGT unit cell.

Of importance, a capacitance between the gate electrode and the cathode electrodes 7 and 8, which corresponds to the capacitance $C_1$ of FIG. 31, is nearly zero because the gate and the cathode electrodes 7 and 8 are not stacked. This reduces the time constant $\tau$ in Eq. 3, and hence, enables the IGT device to operate at enhanced switching speed, e.g., at higher turn-on speed.

Figure 5:
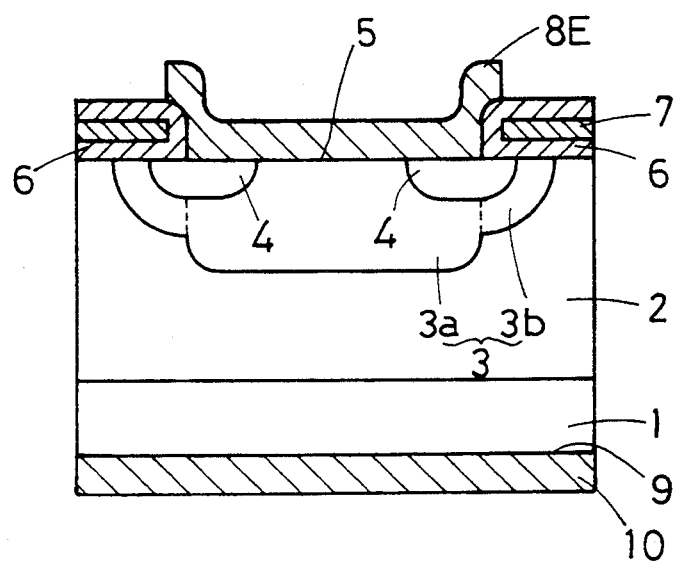
FIG. 5 is a cross sectional view of an IGT unit cell as obtained by modifying the second preferred embodiment of the present invention.

In the second preferred embodiment, it is not necessary to very strictly control the dimensions of the cathode electrodes 8. For example, an IGT unit cell 102a as shown in FIG. 5 includes a cathode electrode 8 which is wider than that of the unit cell 102 of FIG. 2. Thus, the cathode electrode 8 infringes at its end portion 8E upon the oxide film 6. Even with such a structure, the capacitance $C_1$ remains small as long as most surface of the gate electrode 7 is uncovered with the cathode electrode 8.

D. Fabrication Method of IGT of Second Preferred Embodiment

Figure 18:
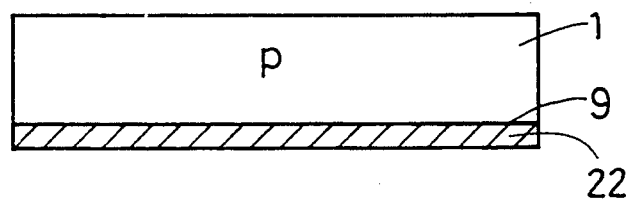
FIGS. 18 to 26 are cross sectional views showing fabrication process of the IGT unit cell of FIG. 2.
Figure 19:
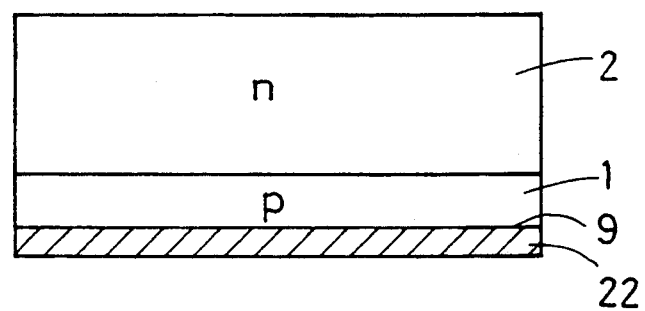
Figure 20:
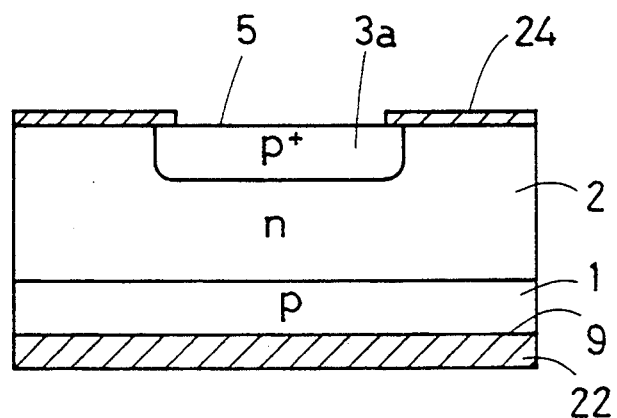

A fabrication process of the IGT unit cell 102 of the second preferred embodiment (FIG. 2) will be described below. As shown in FIGS. 18 to 20, the IGT unit cell 102 is initially processed in the same manner as the IGT unit cell 101 of the first preferred embodiment (FIGS. 9 to 11), only one distinction being that in a fabrication step corresponding to FIG. 20, the p+ type region 3a is developed in a strip shape which extends perpendicular to the drawing sheet of FIG. 20.

Figure 21:
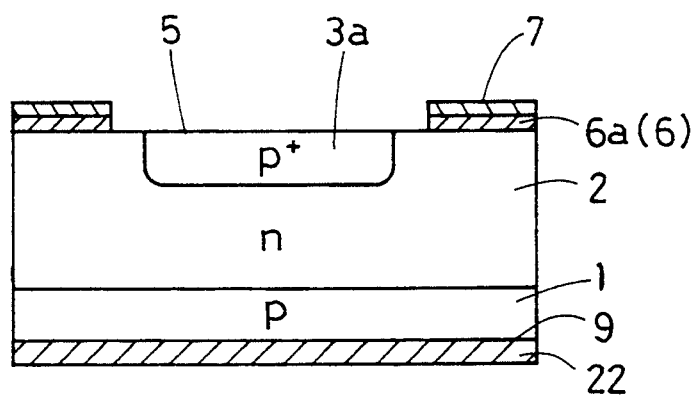

Next, an oxide film 24 is removed, followed by that an oxide film of the thickness of around 1000 angstrom and an overlying polycrystalline silicon film are deposited on the cathode surface 5. The films are patterned by a conventional photolithographic process, thereby defining a region 6a which will later form the gate oxide film 6 and the gate electrode 7, the film 6 and the electrode 7 each extending in the form of a strip and perpendicular to the drawing sheet (FIG. 21).

Figure 22:
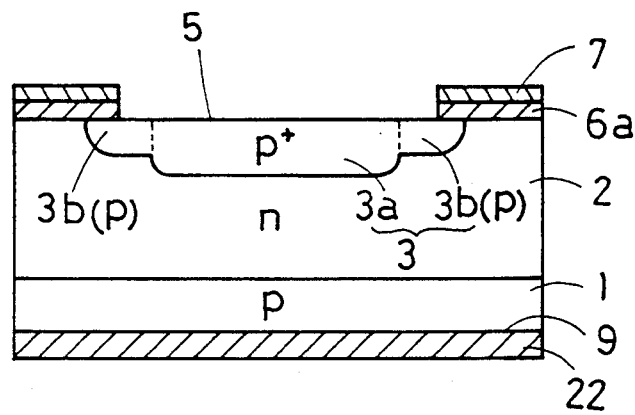

P type impurities are implanted and/or diffused in the p+ type region 3a and the n type region 2 using the gate electrode 7 as a mask, thereby establishing the p type region 3b around the p+ type region 3a. The p type region 3b and the p+ type region 3a constitute the p type base layer 3 (FIG. 22).

Figure 23:
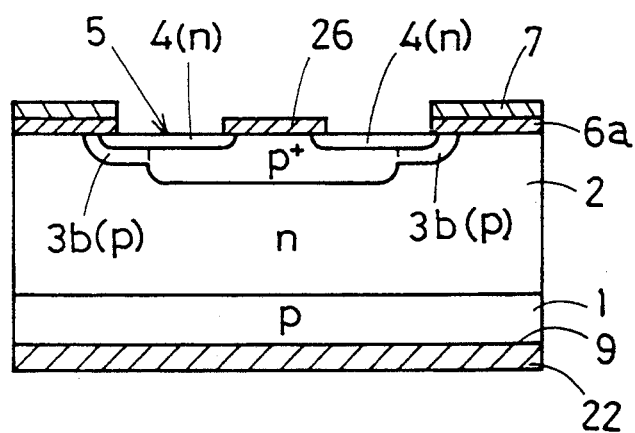
Figure 24:
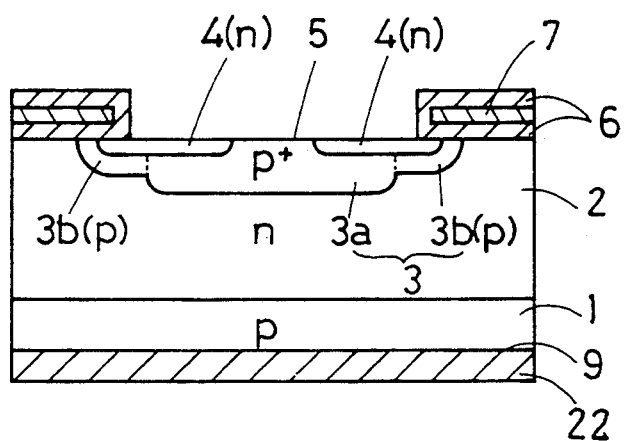

The p+ type region 3a is then locally covered with an oxide film 26 through which n type impurities are implanted and/or diffused in the p type base layer 3. A result of this is the highly doped n type emitter layer 4 spreading at the surfaces of the p+ type region 3a and the p type region 3b (FIG. 23). Subsequently, an oxide film is grown by a photolithographic technique on the gate electrode 7, thereby completing the gate oxide film 6 (FIG. 24).

Figure 25:
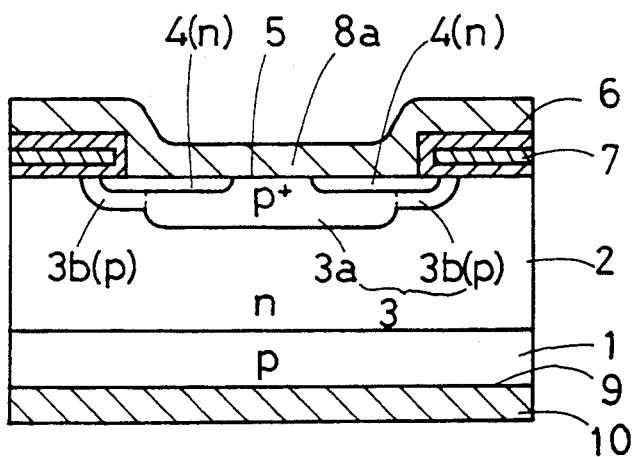
Figure 26:
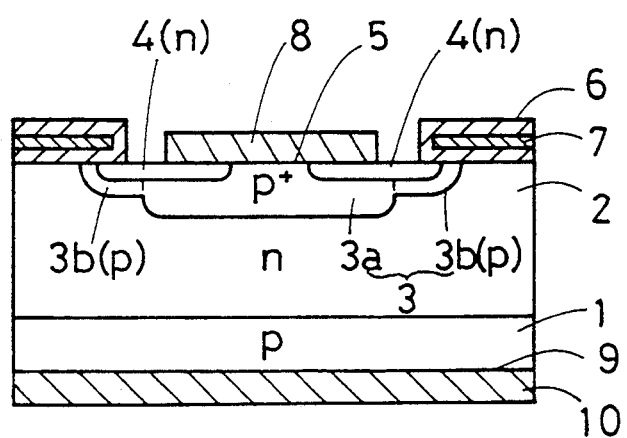

After removing the oxide film 22, aluminum or other metal films are disposed, one over the cathode surface 5 and the oxide film 6 and the another over the anode surface 9 so as to form an electrode layer 8a and the anode electrode 10 (FIG. 25). The electrode layer 8a is then patterned by local removal therefor, defining the cathode electrode 8 exclusively on the cathode surface 5 (FIG. 26). This completes fabrication of the IGT unit cell 102.

E. Third, Fourth and Fifth Preferred Embodiments

Figure 4:
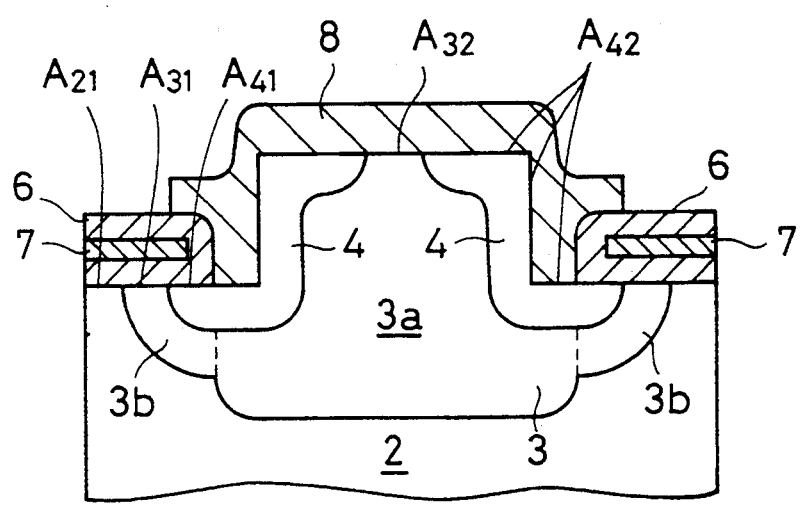
Figure 6:
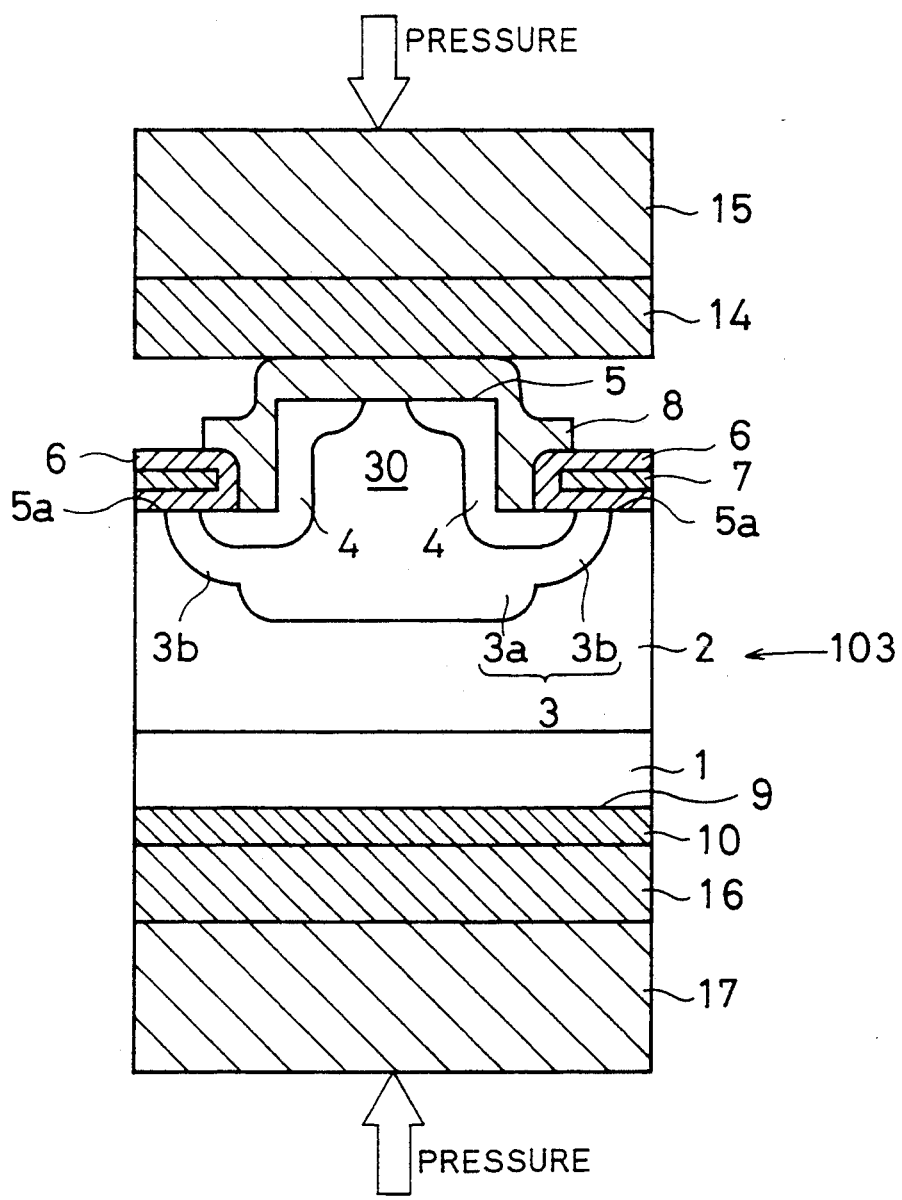
FIG. 6 is a cross sectional view of an IGT unit cell according to a third preferred embodiment of the present invention.

The following is description of a third to a fifth preferred embodiments of the present invention. IGT unit cells of the third to the fifth preferred embodiments meet the third object of the present invention. FIG. 6 shows an IGT unit cell 103 of the third preferred embodiment. The unit cell 103 corresponds to the unit cell 101 of the first preferred embodiment as would be if the cathode electrode 8 is selectively removed in order not to cover the gate electrode 7. As also evident from FIG. 4, a gate insulation film 6 and a gate electrode 7 are on first exposed surfaces $A_{21}$, $A_{31}$ and $A_{41}$ of semiconductor layers 2, 3 and 4. A cathode electrode 8 entirely covers a second exposed surface $A_{32}$ of the p type base layer 3 and a second exposed surface $A_{42}$ of the n type emitter layer 4, and partially overlies the gate electrode 7 and the gate insulation film 6.

Disposed on a recessed surface 5a, the gate electrode 7 and the gate oxide film 6 are protected from stress thereonto in the IGT unit cell 103. Another advantage of the IGT unit cell 103 concerns distortion. A cathode electrode body 15 and an anode electrode body 17 have different expansion coefficients from the IGT unit cell 103, and therefore, exhibit dissimilar expansion. However, by employing a cathode distortion snubbering plate 14 and an anode distortion snubbering plate 16, distortion due to the difference in expansion coefficient will not be transmitted to the unit cell 103.

As further advantage, the cathode electrode 8 disposed not covering the gate electrode 7 allows reduction in an input capacitance $C_{iss}$ of the unit cell 103, thereby accelerating switching operations including device turn-on. Although the gate electrode 7 and the cathode distortion snubbering plate 14 placed above the same have a capacitance therebetween and this capacitance appears to adversely affect the input capacitance $C_{iss}$, the fact is, it doesn't. The gate oxide film 6 and the cathode distortion snubbering plate 14 are spaced from each other by air. Since air has a relatively low dielectric constant, the electrode-snubber capacitance is constrained enough and is negligibly small. The reduced input capacitance $C_{iss}$ hence remains intact.

In addition, since the cathode electrode 8 has the highest surface among the elements forming the unit cell 103, the unit cell 103 may be rectangle-shaped which allows the pressure contact structure.

Figure 27:
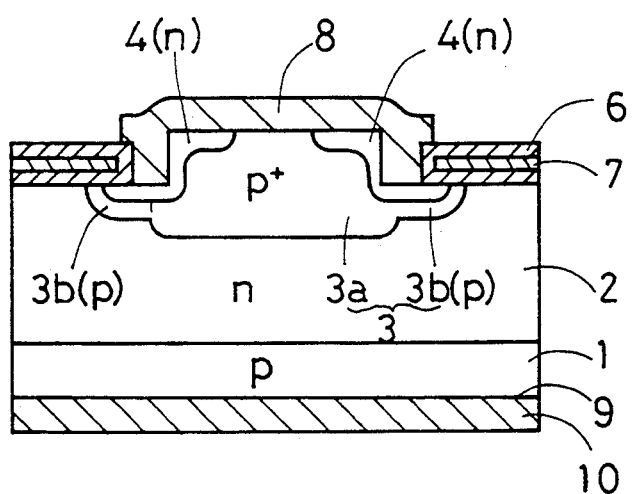
FIG. 27 is a cross sectional view showing a step of fabrication process of the IGT unit cell of FIG. 5.

During steps of fabrication thereof, the unit cell 103 is processed in the same manner as the unit cell 101 of the first preferred embodiment (FIGS. 9 to 17), with additional step of locally removing and thereby patterning the cathode electrode 8 (FIG. 27) following the step of FIG. 17.

Figure 7:
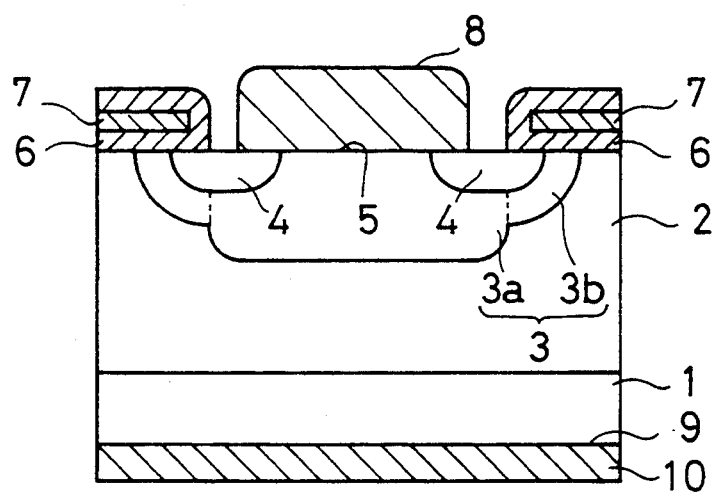
FIG. 7 is a cross sectional view of an IGT unit cell according to a fourth preferred embodiment of the present invention.

FIG. 7 is a cross sectional view of an IGT unit cell 104 of the fourth preferred embodiment of the present invention. The IGT unit cell 104 includes a flat cathode surface 5. A cathode electrode 8 is deposited exclusively on the cathode surface 5, in order not to infringe upon a gate oxide film 6, to a thickness larger than that of the gate oxide film 6 and a gate electrode 7 as considered as one element. This configuration permits pressure contact to be made to the unit cell 104 by using the external electrodes 15 and 17 and the distortion snubbering plates 14 and 16 (FIG. 1) of the first preferred embodiment. Thus, the IGT unit cell 104 may be rectangularly shaped.

The meritorious effects of the first and the second preferred embodiments are also present in the IGT unit cell 104, namely, higher turn-on and prevention of damage to the Gate electrode 7 and the Gate oxide film 6 associated to the pressure contact structure.

The unit cell 104 is fabricated in the same manner as the unit cell 102 of the second preferred embodiment (FIGS. 18 to 26), with a slight modification that the unit cell 104 is of a rectangle shape and the electrode layer 8a of FIG. 25 is formed thicker than a combination of the oxide film 6 and the gate electrode 7. The unit cells 104 are arranged in a matrix on an IGT pellet.

Figure 8:
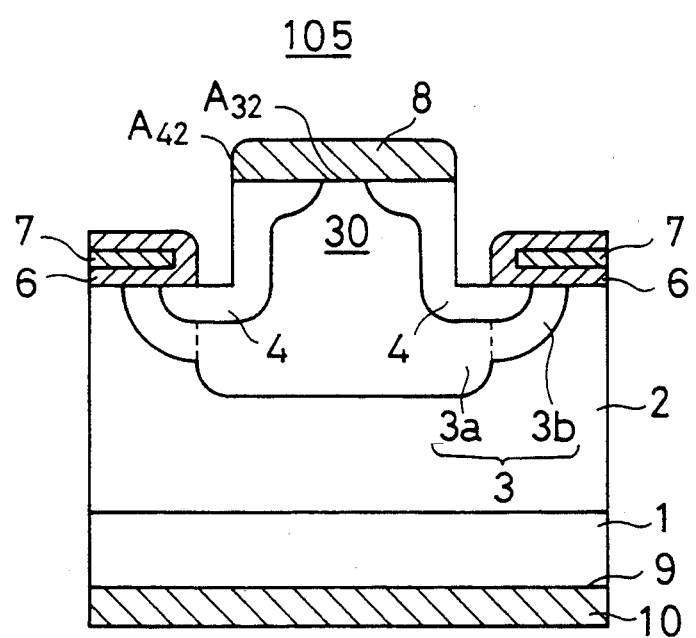
FIG. 8 is a cross sectional view of an IGT unit cell according to a fifth preferred embodiment of the present invention.

FIG. 8 shows an IGT unit cell 105 of the fifth preferred embodiment of the present invention. Only distinction between the unit cell 105 and the unit cell 103 of FIG. 6 is that a cathode electrode 8 is disposed only on the top surface of a projection 30. As shown in FIG. 8, an n type emitter layer 4 has a second exposed surface $A_{42}$ (FIG. 4) exclusively on the projection 30, whereas a second exposed surface $A_{32}$ (FIG. 4) of the p type base layer 3 remains the same as that of the unit cell 103.

Ensuring a particularly low capacitance between the cathode and the gate electrodes 8 and 7, the unit cell 104 of FIG. 7 is advantageous over the unit cell 102a of FIG. 5 in which the cathode electrode 8 is relatively easily patterned and in contact with the n type emitter layer 4 in a large area. The electrode bodies 15 and 17 and the distortion snubbering plates 14 and 16 are employable also in the unit cell 105 of the fifth preferred embodiment.

The unit cell 105 is fabricated in the same manner as the unit cell 103 (FIG. 6) of the third preferred embodiment with a slight modification of patterning the cathode electrode 8 narrower.

F. Other Modifications

The anode distortion snubbering plate 16 of each preferred embodiment which requires the pressure contact structure may be integrated with the anode electrode 10. In those embodiments, the IGTs disclosed therein may be wire bonded in stead of pressure contact.

The foregoing has described the present invention only in relation to IGTs. Nevertheless, it is intended that the application of the present invention involves other MOS-gate structure semiconductor devices such as MOSFETs and MCTs.

To apply the invention herein disclosed to a MOSFET, the p type emitter layer 1 is omitted or replaced by an n+ type layer. In application to a MCT, the p type layer 1 is replaced by a two layer structure consists of an n+ type layer and an overlying p− type layer.

While the invention has been shown and described in detail, the foregoing description is in all aspects illustrative and not restrictive. It is understood that numerous modifications and variations can be devised without departing from the scope of the invention.

What is claimed is:

1. A MOS semiconductor device, comprising:
   (a) a first conductivity type first semiconductor layer;
   (b) a second conductivity type second semiconductor layer selectively formed in a top major surface of said first semiconductor layer, said second semiconductor layer intercepting said top major surface of said first semiconductor layer;
   (c) a third semiconductor layer selectively formed within a boundary of said second semiconductor layer, said third semiconductor layer intercepting a top surface of said second semiconductor layer;
   (d) an insulation film covering only first exposed areas of said first to said third semiconductor layers;
   (e) a control electrode disposed within said insulation film;
   (f) a first main electrode layer covering only second exposed areas of said second and said third semiconductor layers, said first and said second exposed areas of said second and said third semiconductor layers being spaced from each other on the surface of said third semiconductor layer, said first main electrode layer having an upper surface projecting higher than an upper surface of said insulating film and said control electrode disposed therein;
   (g) a second main electrode layer disposed in electrical contact with a bottom major surface of said first semiconductor layer.

2. A MOS semiconductor device of claim 1, wherein said insulation film covering only said first exposed areas and said first main electrode covering only said second exposed areas are spaced from each other by an air space gap.

3. A MOS semiconductor device of claim 1, wherein said second main electrode layer includes: (g-1) a fourth semiconductor layer of the second conductivity type disposed on said bottom major surface of said first semiconductor layer; and (g-2) a conductive body disposed on said fourth semiconductor layer.

4. A MOS semiconductor device in which a plurality of MOS unit cell structures are arranged on a top major surface of a first conductivity type first semiconductor layer, each one of said plurality of MOS unit cell structures comprising:
   (a) a second conductivity type second semiconductor layer intercepting said top major surface of said first semiconductor layer;
   (b) a plurality of third semiconductor layers selectively formed within a boundary of said second semiconductor layer, said plurality of third semiconductor layers each intercepting a top surface of said second semiconductor layer;
   (c) an insulation film covering only first exposed surfaces of said first to said third semiconductor layers;
   (d) a control electrode disposed within said insulation film;
   (e) a first main electrode layer covering second exposed areas of said second and said third semiconductor layers, said second exposed areas of said second and said third semiconductor layers being spaced from said first exposed areas of said second and said third semiconductor layers, respectively; and
   (f) a second main electrode layer disposed in electrical contact with a bottom major surface of said first semiconductor layer,
   wherein:
      said first main electrode layer is electrically connected to said second and third semiconductor layers in said second exposed areas thereof;
      said first main electrode layers of said plurality of MOS unit cell structures taken as a whole are an electrode pattern of a comb-like configuration, each one of said first main electrode layers corresponding to a tooth of said comb-like configuration;
      said insulation films of said plurality of MOS unit cell structures taken as a whole are an insulation film pattern of a comb-like configuration, each of insulation film corresponding to a tooth of said comb-like configuration; and
      said electrode pattern and said insulation film pattern are laterally interdigitated.

5. A MOS semiconductor device of claim 1, wherein said first main electrode layer is disposed so as to not overlap said control electrode.

6. A MOS semiconductor device of claim 1, wherein said first main electrode layer is disposed not in contact with said insulation film.

7. A MOS semiconductor device of claim 4, wherein said first main electrode layer is disposed so as to not overlap said control electrode.

8. A MOS semiconductor device of claim 4, wherein said first main electrode layer is disposed not in contact with said insulation film.

* * * * *